(12) United States Patent
Sasaki et al.

(10) Patent No.: US 7,151,674 B2
(45) Date of Patent: Dec. 19, 2006

(54) MOLD-TYPE ELECTRONIC CONTROL UNIT

(75) Inventors: Kouji Sasaki, Numazu (JP); Tomihiro Iizumi, Numazu (JP)

(73) Assignee: Kokusan Denki Co., Ltd., Shizuoka-ken (JP)

( * ) Notice: Subject to any disclaimer, the term of this patent is extended or adjusted under 35 U.S.C. 154(b) by 291 days.

(21) Appl. No.: 10/930,498

(22) Filed: Aug. 31, 2004

(65) Prior Publication Data

US 2005/0057902 A1    Mar. 17, 2005

(30) Foreign Application Priority Data

Sep. 12, 2003    (JP) .............................. 2003-320770

(51) Int. Cl.
*H05K 5/00* (2006.01)
*H05K 1/14* (2006.01)

(52) U.S. Cl. ...................... 361/752; 361/736; 174/52.1

(58) Field of Classification Search ...................... None
See application file for complete search history.

(56) References Cited

U.S. PATENT DOCUMENTS

| | | | |
|---|---|---|---|
| 5,285,010 A * | 2/1994 | Huber | 174/59 |
| 5,699,235 A * | 12/1997 | Tsurumiya et al. | 361/803 |
| 5,957,547 A * | 9/1999 | Schliebe et al. | 303/119.3 |
| 6,282,092 B1 * | 8/2001 | Okamoto et al. | 361/704 |
| 6,875,029 B1 * | 4/2005 | Kawabata et al. | 439/76.2 |
| 2002/0062698 A1 * | 5/2002 | Baba et al. | 73/754 |
| 2002/0154466 A1 * | 10/2002 | Morino et al. | 361/211 |
| 2005/0206357 A1 * | 9/2005 | Laurent et al. | 323/282 |

FOREIGN PATENT DOCUMENTS

| | | | |
|---|---|---|---|
| JP | 03131723 A | * | 6/1991 |
| JP | 07/221429 | | 8/1995 |
| JP | 2001-152906 | | 6/2001 |

* cited by examiner

*Primary Examiner*—Boris Chervinsky
(74) *Attorney, Agent, or Firm*—Pearne & Gordon LLP

(57) ABSTRACT

A mold-type electronic control unit comprising: a unit body which includes a printed circuit board, a component case which includes an opening opened toward the circuit board and a hole opened toward the opposite side of the opening and is mounted on the circuit board, a first packing which includes a recess portion and a window portion opened inside of the recess portion and is attached so as to close the opening of the component case with the recess portion directed toward the printed circuit board, a pressure sensor housed in the recess portion of the first packing and having a pressure introducing portion exposed in the component case through the window portion, and a second packing mounted on an outer side of the component case; and a resin molded portion covering the unit body, wherein said second packing is used as means for preventing resin from flowing toward the hole of the case when the molded portion is injection molded.

7 Claims, 4 Drawing Sheets

MOLD-TYPE ELECTRONIC CONTROL UNIT

TECHNICAL FIELD OF THE INVENTION

The present invention relates to an electronic control unit suitable for constituting a controller for an ignition system, an injection system for internal combustion engine or the like and to a manufacturing method thereof. More particularly, the invention relates to a mold-type electronic control unit in which a unit body is resin-molded and to a manufacturing method thereof.

BACKGROUND OF THE INVENTION

There has been used a control unit constituting a controller for an ignition system, an injection system for an internal combustion engine or the like, in which a unit body including a printed circuit board and components mounted on the printed circuit board is resin-molded in order to provide water proofing and vibration proofing property to the control unit.

In the case where a component constituting a unit body does not have an exposure required portion which is required for being exposed to outside while the component is used, the unit body may be covered with a resin-molded portion. However, in the case where components such as a pressure sensor, a variable impedance element (for example, a variable resistor) having an operation knob, and a display device having a indicator such as a liquid crystal display board are included in a component constituting a unit body, an exposure required portion of these components is required not to be covered with the molded portion.

The exposure required portion of the pressure sensor is a pressure introducing portion having a hole for introducing a detected pressure to a sensor, and the exposure required portion of the variable impedance element is an operation knob which is controlled when impedance is adjusted. The exposure required portion of the display device is an indicator such as a liquid-crystal display device.

In Japanese Patent Application Laid-Open Publication Nos. 7-221429 and 2001-152906, there are proposed mold-type electronic control units in which a unit body including a specific component having an exposure required portion on a printed circuit board is covered with a resin molded portion.

In the mold-type electronic control unit, a specific component having an exposure required portion is housed in a component case, and the component case is mounted to a printed circuit board together with other components. Then, the printed circuit board is inserted into a sheathing case, and thermosetting resin such as epoxy resin or polyurethane resin is poured into the sheathing case until a lead terminal of the component is hidden to form a molded portion.

However, there have been problems as described below in the mold-type electronic control unit shown in Japanese Patent Application Laid-Open Publication Nos. 7-221429 or 2001-152906.

(a) Many components are needed since a sheathing case is required, which causes the cost to be increased.
(b) A number of manufacturing steps is increased since a step for fixing a printed circuit board to the sheathing case is required, which causes the cost to be increased.
(c) It takes time to cure resin since thermosetting resin is used, which requires long manufacturing time.
(d) A thermostatic oven is needed for curing the thermosetting resin, which causes the cost for manufacturing facilities to be increased.
(e) Since the components are exposed to high temperature when pouring the thermosetting resin into the sheathing case, the components are likely to be deteriorate or broken.
(f) The electronic control unit can not be recycled since the thermosetting resin is used.

The above problems may be solved by forming a molded portion by injection molding; however, in the case where components being attached to a printed circuit board include a specific component having an exposure required portion, a special consideration is necessary so that the exposure required portion of the specific component is not covered with the molded portion.

SUMMARY OF THE INVENTION

Therefore, an object of the invention is to provide a mold-type electronic control unit comprising a unit body which includes a printed circuit board, a plurality of components including a specific component having an exposure required portion and mounted to the printed circuit board, and a resin molded portion covering the unit body, wherein the resin molded portion can be formed by injection molding without losing a function of the specific component.

An another object of the invention is to provide a method for producing a mold-type electronic control unit comprising a unit body which includes a printed circuit board, a plurality of components including a specific component having an exposure required portion and mounted to the printed circuit board, and a resin molded portion covering the unit body, wherein the resin molded portion can be formed by injection molding without losing a function of the specific component.

According to the invention, there is provided a mold-type electronic control unit comprising a unit body having a plurality of components on a printed circuit board and a molded portion which is injection molded so as to cover the unit body, the plurality of components including a specific component having an exposure required portion required to be exposed to outside when being used.

The electronic control unit comprises: a component case having an opening opened toward the printed circuit board at one axial end of the case, having a hole for opening an internal space of the component case to outside at the other axial end of the case, having a packing receiving surface extending so as to surround a central axis of the case outside thereof, with the packing receiving surface directed to the other axial end of the component case and one axial end of the component case being fixed to the printed circuit board; a first packing which is press-fitted into the component case from the opening to prevent resin for molding from flowing into the internal space of the component case when the molded portion is injection molded; and a second packing secured to the packing receiving surface so as to contact with an inner surface of a mold for injection molding to prevent resin for molding from flowing toward the hole of the component case when the molded portion is injection molded.

The first packing comprises a recess portion opened to the printed circuit board and a window portion one end of which is opened to the recess portion and the other end of which is opened to the component case, the specific component is housed in the recess portion of the first packing, and the exposure required portion of the specific component is exposed to the internal space of the component case through the window portion.

With the construction as described above, since the first packing prevents resin from entering into the component case and the second packing prevents resin from flowing into the hole of the component case when the molded portion is injection molded, the molded portion can be injection molded without covering the exposure required portion of the specific component with resin and without plugging the hole which opens to the outside the internal space of the component case where the exposure required portion of the specific component is exposed.

According to one aspect of the invention, a pressure sensor having a pressure introducing portion is used as the specific component described above. In this case, the pressure introducing portion of the pressure sensor becomes the exposure required portion.

According to another aspect of the invention, a variable impedance element having an operation knob is used as the specific component. In this case, the operation knob of the variable impedance element becomes the exposure required portion.

In a further embodiment of the invention, a display device is used as the specific component. In this case, an indicator of the display device becomes the exposure required portion.

According to another aspect of the invention, the unit body comprises a unit side connector which is fixed to the printed circuit board and connected to a circuit constituted by the printed circuit board and the components mounted to the circuit board. An external connector connected to an external circuit is connected to the unit side connector when the circuit constituted on the printed circuit board is connected to the external circuit. Most parts of the unit side connector except for its end portion to be connected to the external connector are covered with the molded portion.

It is preferred that the above molded portion is formed by polyaramid resin. Since it is possible for the polyaramid resin to be injection molded under low pressure and low temperature, the components have never been exposed to high pressure and high temperature when polyaramid resin is used for the molded portion to be injection molded, which can avoid possibilities that the components are deteriorated or damaged when the molded portion is injection molded.

In addition, according to the present invention, there is provided a method for manufacturing a mold-type electronic control unit comprising a first process for forming a unit body having on a printed circuit board a plurality of components including a specific component having an exposure required portion required to be exposed to outside when being used and a second process for forming a molded portion covering the unit body.

In the invention the first process comprises a step of providing a component case having an opening opened toward the printed circuit board at one axial end of the case, a hole for opening an internal space of the component case to outside at the other axial end of the case, and a packing receiving surface extending so as to surround a central axis of the case outside thereof, with the packing receiving surface directed to the other axial end of the component case; providing a first packing having a recess receiving the specific component and a window portion one end of which is opened in the recess and the other end of which is opened in the component case, and being press-fitted into the component case from the opening of the component case; and providing a second packing fixed to the packing receiving surface; and a step of fixing the component case to the printed circuit board, with the specific component fitted to the recess, and with the exposure required portion of the specific component is exposed to the internal space of the component case through the window portion.

Then, the second process comprises a step of inserting the unit body to a mold for injection molding with the second packing being contacted with an inner surface of the mold, and a step of injecting melted resin into the mold while the first packing preventing the resin from flowing into the component case, and while the second packing preventing the resin from flowing toward the hole of the component case.

As aforementioned, according to the present invention, since the first packing prevents resin from entering into the component case, and the second packing prevents resin from entering to the hole of the component case, the molded portion can be formed by injection molding without covering the exposure required portion of the specific component with resin and without plugging the hole which opens to the outside the internal space of the component case where the exposure required portion of the specific case is exposed.

BRIEF DESCRIPTION OF THE DRAWINGS

The above and other objects and features of the invention will be apparent from the detailed description of the preferred embodiments of the invention, which are described and illustrated with reference to the accompanying drawings, in which.

DETAILED DESCRIPTION OF THE PREFERRED EMBODIMENTS

Figure 1:
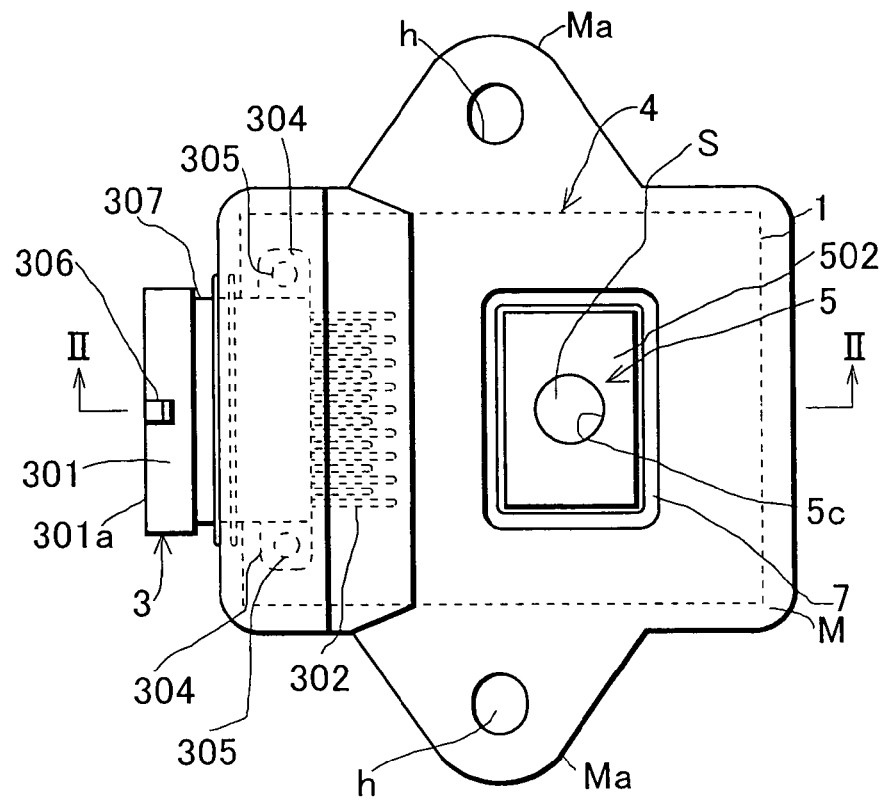
FIG. 1 is a top view of a mold-type electronic control unit according to an embodiment of the invention.
Figure 2:
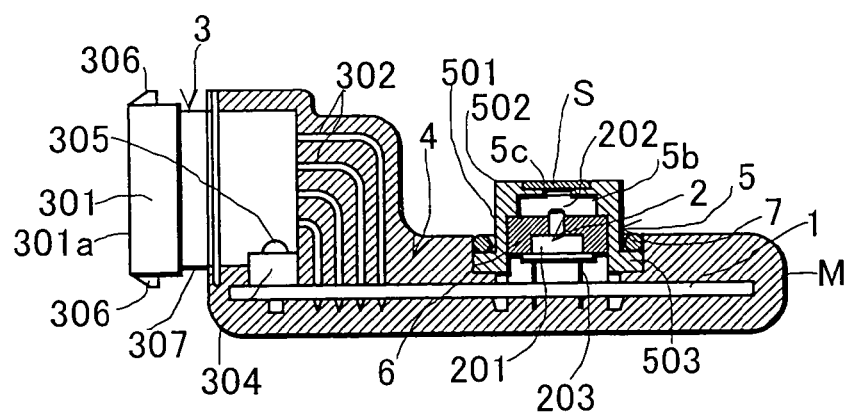
FIG. 2 is a cross sectional view taken along a line II—II of FIG. 1
Figure 3:
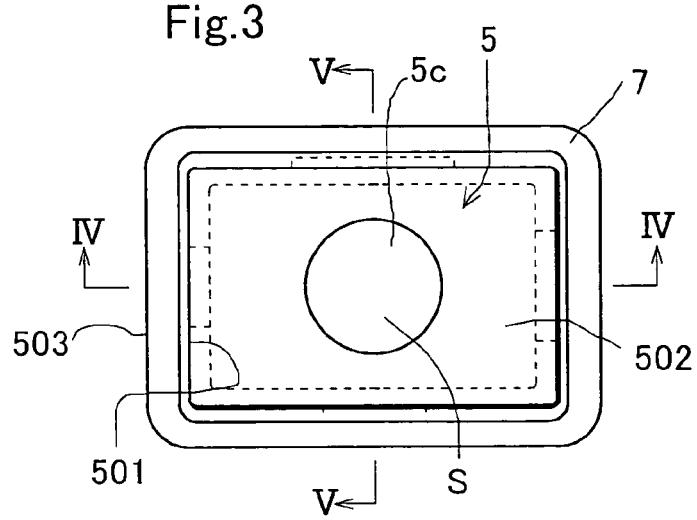
FIG. 3 is a top view of a component case housing a specific component in the embodiment shown in FIG. 1.

A preferred embodiment of the invention will be described in further detail with reference to the accompanying drawings. In FIGS. 1 and 2, a reference numeral 1 denotes a printed circuit board. On the printed circuit board 1, there are attached a pressure sensor 2 for detecting an atmospheric pressure, other components (not shown) such as a microcomputer, and a unit side connector 3 being connected to an external connector which is connected to an external circuit when a circuit constituted on the printed circuit board is connected to the external circuit. The printed circuit board 1, a plurality of components including the pressure sensor 2 and the unit side connector 3 constitute a unit body 4 of an electronic control unit for controlling a fuel injection system and/or an ignition system for an internal combustion engine, and the unit body 4 is covered with a molded portion M.

The pressure sensor 2 comprises a pressure detection part housed inside of a body (a package) 201, a pressure introducing portion 202 provided on one end of the body 201 and lead terminals 203 led out from the other end of the body 201, and is attached to the printed circuit board by inserting the lead terminals 203 into through holes formed through the printed circuit board 1 and by soldering the lead terminals 203 to a circuit pattern formed back of the printed circuit board. The pressure introducing portion 202 includes an air vent opened to atmosphere, and an atmospheric pressure is introduced to the pressure detection part through the pressure introducing portion.

In this embodiment, the pressure sensor 2 is a specific component, and the pressure introducing portion 202 is an exposure required portion required for being exposed when being used.

The unit side connector 3 is a known male or female type connector, which comprises a connector shell 301 having a tip portion 301a to be connected to the external connector, a large number of contacts (not shown) arranged inside of the connector shell 301 and connected to corresponding contacts of the external connector, and a large number of lead terminals 302 one ends of which are connected to the large number of contacts, respectively, and the other ends of which are led out from a rear edge side of the connector shell 301 to outside. The connector shell 301 is arranged on one end surface of the printed circuit board 1 with the tip portion 301a of the shell directed toward outside, and is fixed to the printed circuit board 1 by fastening each of protrusions 304, 304 formed on an end portion of the connector shell 301 toward the printed circuit board with a fastening member 305 such as a screw. Each of the leas terminals 302 led out from the connector shell 301 is inserted to a through hole formed through the printed circuit board 1 and is soldered to a circuit pattern formed on the back of the printed circuit board. In FIGS. 1 and 2, a reference numeral 306 refers to protrusions provided on the connector shell 301. The protrusions are seized by a catch provided on the external connector not shown to prevent the external connector from coming off. A reference numeral 307 denotes a groove peripherally provided on an outer periphery near the tip portion of the connector shell.

Figure 4:
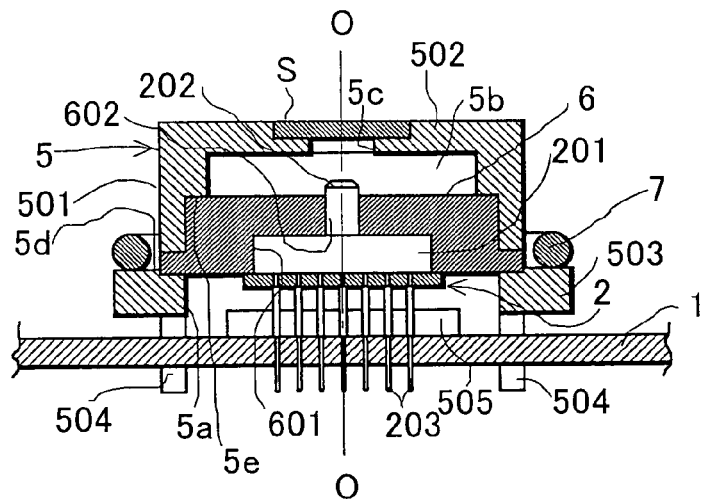
FIG. 4 is a cross sectional view taken along a line IV—IV of FIG. 3.
Figure 5:
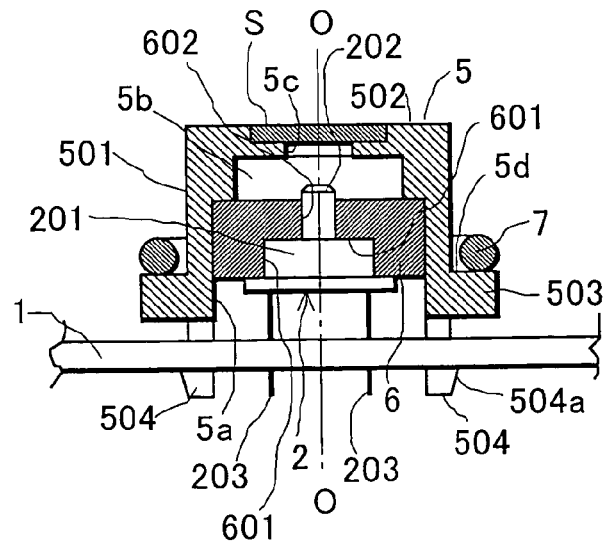
FIG. 5 is a cross sectional view taken along a line V—V of FIG. 3.

In the present invention, a component case 5 for housing a pressure sensor 2 is mounted on the printed circuit board 1. As shown in FIG. 4, the component case 5 used in the invention comprises a side wall portion which is formed so as to continuously surround a central axis O—O of the case 5 which section is rectangular shaped and which has an opening 5a opened toward the printed circuit board 1 at one axial end, and a ceiling portion 502 provided at the other axial end of the side wall portion 501. On the component case 5, there is provided at the central of the ceiling portion 502 a hole 5c for opening an internal space 5b of the case to outside. A seal S having permeability and water repellency is attached on the hole 5c so as to cover the hole in order to prevent water from entering into the component case through the hole 5c. On the outer side of the side wall portion 501, there is formed a flange 503 of rectangular annular shape, which is continuously extending along the outer surface of the side wall portion 501 so as to surround the central axis O—O of the case 5, and a surface of the flange 503 opposite to the printed circuit board (a surface facing to the other axial end) is a packing receiving surface 5d. A plurality of leg portions 504 are protrusively provided on one axial end of the side wall portion 501 of the component case 5, each leg portion is press-fitted into mounting hole provided through the printed circuit board 1 to fix the component case 5 to the printed circuit board 1. Seizing protrusions 504a (FIG. 5) engaging with the back surface of the printed circuit board are formed on the tips of every leg portions 504, and the engagement of the seizing protrusions 504a with the back surface of the printed circuit board stops coming off of each leg portion 504. On one end of the side wall portion 501 of the component case 5, a notch 505 (FIG. 4) which is opened toward the printed circuit board 1 is formed. The notch 505 is used for flowing resin into the internal space of the component case when the molded portion M is injection molded.

A reference numeral 6 refers to a first packing which is press-fitted to the component case from the opening 5a so as to close the opening 5a of the component case 5 and prevents resin from flowing into the component case 5 when the molded portion M is injection molded. The first packing 6 comprises a recess portion 601 which is formed so as to receive the body 201 of the pressure sensor (the specific component) 2 without forming substantial gap between the sensor 2 and an inner surface of the recess portion, and a window portion 602 one end of which is opened in the recess portion 601 and the other end of which is opened in the component case. The first packing 6 is made contact with a step portion 5e (FIG. 4) formed on an inner surface of the component case to be positioned.

A reference numeral 7 refers to a second packing which is formed in rectangular annular shape to continuously surround the side wall portion 501 of the component case 5 and fixed to the packing receiving surface 5d by adhesion. The second packing is in contact tightly with the inner surface of the mold for injection molding when the molded portion M is molded and prevents resin for molding from flowing toward the hole 5c of the component case 5.

The component case 5 is attached to the printed circuit board 1 after soldering components including the pressure sensor 2 to the printed circuit board 1. When the component case 5 is attached to the printed circuit board 1, the body 201 of the pressure sensor 2 is press-fitted into the recess portion 601 of the first packing 6, the pressure introducing portion 202 (the exposure required portion) of the pressure sensor is exposed to the internal space 5b of the component case 5 through the window portion 602, and the component case 5 is pushed toward the printed circuit board to engageably insert the leg portions 504 to the mounting holes of the printed circuit board 1.

In a method for manufacturing a mold-type electronic control unit of the present invention, there are provided a component case 5 as described above, a first packing 6 and a second packing 7. In the method, after a unit body 4 is formed by press-fitting a pressure sensor 2 into the recess portion 601 of the first packing 6 and by mounting components and the component case 5 on a printed circuit board in the state where a pressure introducing portion (an exposure required portion) 202 is exposed to a space 5b in the component case 5 through a window portion 602 of the first packing, the unit body 4 is disposed in a mold for injection molding so that the second packing is in contact with an inner surface of a mold. Then, melted resin is injected into the mold to form a molded portion M, while the first packing 6 prevents resin from flowing into the component case 5, and the second packing 7 prevents the resin from flowing toward a hole 5c of the component case.

As shown in FIG. 2, the molded portion M is provided so that most part of the side wall 501 and the ceiling portion 502 of the component case 5 is exposed and so that the most part except for a tip portion 301a of a unit side connector 3 is covered. For economizing resin, it is preferred to set thickness of each part of the molded portion M to be a minimum required for obtaining necessary dielectric strength and mechanical strength.

As shown in FIG. 1, at the cross-directional both ends of the protrusions Ma, wing-like protrusions Ma are formed. In each protrusion Ma, there are formed mounting holes h for inserting fastening members such as a screw which is used when the unit is fixed to a mounting position.

Figure 6:
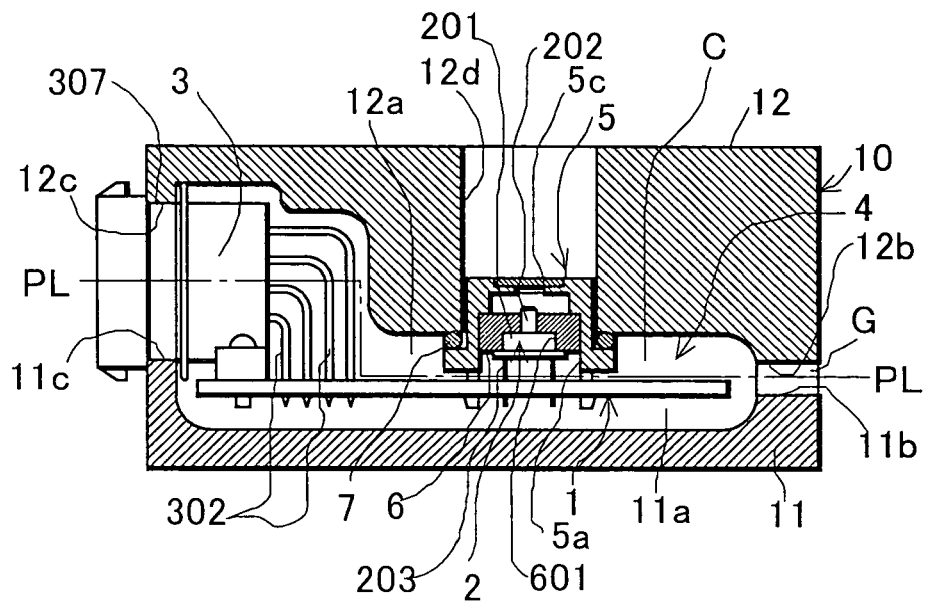
FIG. 6 is a cross sectional view of a mold for injection molding and a unit body inserted inside of the mold.

A structure of a main part of a mold 10 used for molding the molded portion M is shown in FIGS. 6 to 9. As shown in FIG. 6, the mold 10 is made in two halves which are a lower mold 11 and an upper mold 12. PL in FIG. 6 refers to a parting line showing a border between the lower mold 11 and the upper mold 12, and G refers to a gate.

The lower mold 11 comprises a recess portion 11a for forming a molded portion covering the back side of the printed circuit board, a recess portion 11b consisting a half of the gate G and a recess portion 11c engaged with a bottom half portion of a groove 307 formed on an outer periphery of the tip side of the unit side connector 3.

The upper mold 12 comprises: a recess portion 12a for forming the molded portion covering right side of the printed circuit board 1, a lead terminal 203 of the pressure sensor, other components (not shown) implemented on the printed circuit board and connector 3; a recess portion 12b for forming a half of the gate G, a recess portion 12c engaged with a upper half portion of the groove 307 formed toward the tip of the connector 3; and a window portion 12d receiving the component case 5.

Figure 7:
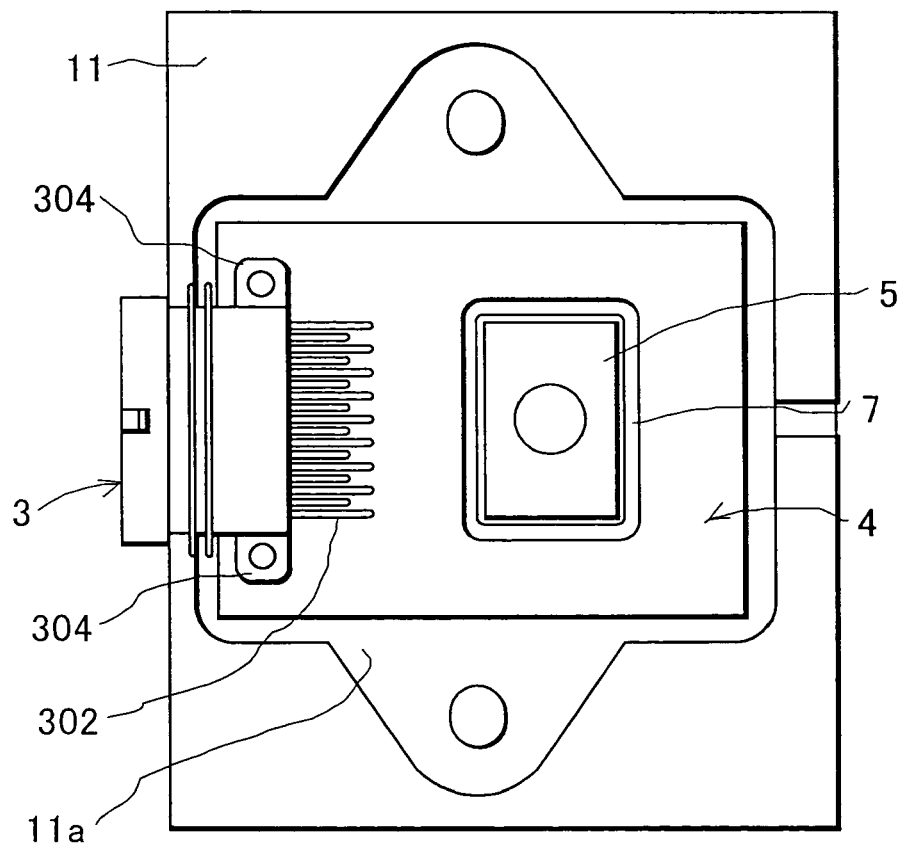
FIG. 7 is a top view of a lower mold and a unit body attached to the lower mold.
Figure 8:
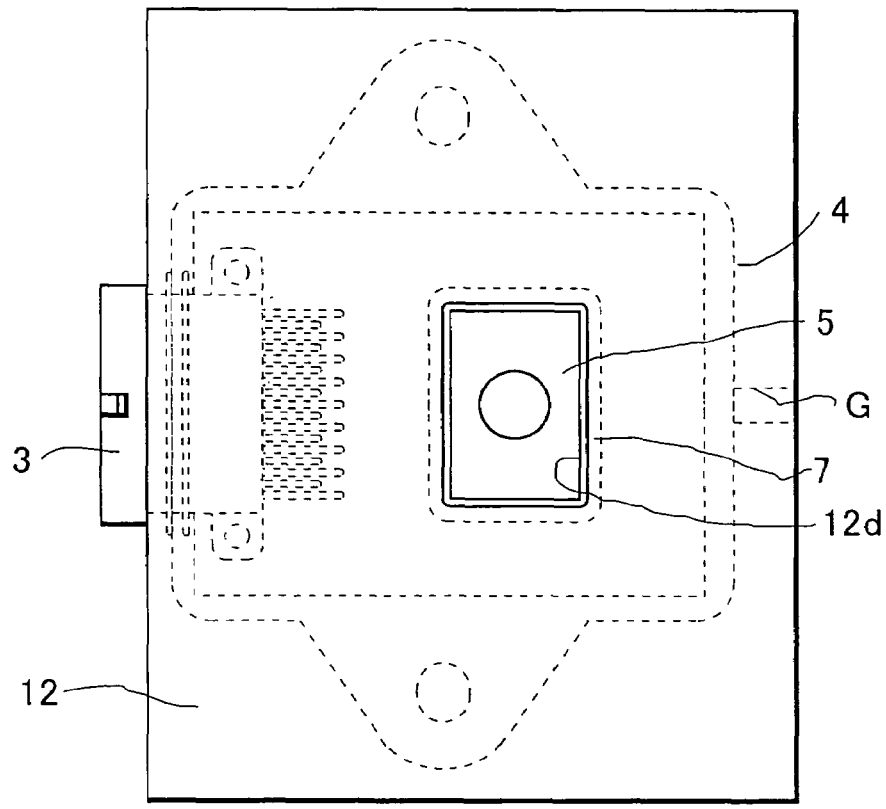
FIG. 8 is a top view of FIG. 6.

When the molded portion M is formed, at first, the unit 4 is attached to the lower mold 11 as shown in FIG. 7; next, the upper mold 12 is butted with the lower mold 11 to form a cavity C by the recess portion 11a of the lower mold 11 and the recess portion 12a of the upper mold 12 as shown in FIG. 6 and to contact the second packing 7 with an inner surface of the mold 10. Then, resin is injected into the cavity C from the gate G in order to form the molded portion M.

Figure 9:
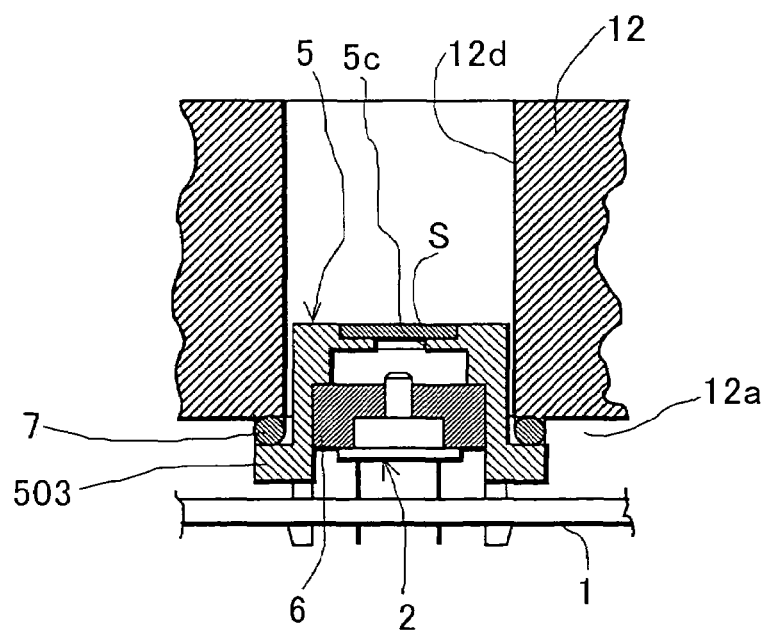
FIG. 9 is a cross sectional view of a main part of FIG. 6 showing a relationship between an upper mold and a pressure sensor.

In the present invention, the recess portion 12a of the upper mold 12 is formed so that the circumference of the opening of the window portion 12d of the upper mold 12 is in contact with the second packing 7 as shown in FIG. 9, when the upper mold 12 is butted with the lower mold 11. In this way, the second packing 7 provided so as to surround the component case 5 is in contact with the bottom (inner) surface of the upper mold 12 to prevent a part of resin from flowing toward the hole 5c of the component case 5 when the molded portion is molded, thereby preventing the hole 5c from being closed by resin.

It is preferred that polyaramid resin which can be injection molded under low temperature and low pressure is used as thermoplastic resin forming the molded portion M. If such resin is used, it is possible to prevent applying of high temperature or high injection pressure on the components when molding resin, which prevents the components from being deteriorated or damaged without failure.

As aforementioned, since the molded portion can be formed by injection molding, the present invention brings many advantages as listed below.

(A) The cost of the unit can be cut down because a sheathing case is unnecessary.
(B) The manufacturing cost can be cut down by reducing manufacturing steps since a step for installing the sheathing case to the printed circuit board is unnecessary.
(C) The manufacturing efficiency can be improved by shortening the curing time since thermoplastic resin is used. If polyurethane resin which is thermosetting resin is used, it is required about 5 hours to cause resin to cure after resin is injected into the sheathing case. On the other hand, if polyaramid resin is used, about 30 seconds will take for curing after resin is injected.
(D) The cost for manufacturing facilities can be reduced since a thermostatic oven for curing resin is not required.
(E) It becomes possible for the molded portion to be injection molded under low temperature and low pressure if polyaramid resin is used for the molded portion, which prevents the components from being deteriorate or broken.
(F) In the case where the unit body is housed in the sheathing case, the connector used when the circuit of the unit is connected to the external circuit can not be integrally mounted on the unit. However, in the present invention, the connector can be integrally mounted on the unit by casting the connector to the molded portion since the molded portion is formed by injection molding.
(G) The electronic control unit can be recycled since the molded portion is formed by thermoplastic resin.

Although the pressure sensor is used as the specific component having the exposure required portion in the above described embodiment, the present invention may be applied to the case where a component having an operation knob or axis as the exposure required portion like a variable resistor, a display device having an indicator as the exposure required portion or the like is provided used as the specific component. The hole 5c provided in the component case is suitably formed according to the constitution of the exposure required portion of the component housed inside of the component case. In the embodiment described above, a relatively small hole is provided at the ceiling portion of the component case; however under certain circumstances, the entire other axial end of the component case may be opened to outside without having a ceiling portion in the component case. Also, the hole of the component case may be closed with a removable cover (for example, a screw cap) in the case where it is unnecessary to always expose the exposure required portion of the specific component to outside. For example, in the case where the specific component housed inside of the component case is the variable resistor and it is not required that the variable resistor is always adjusted, the hole on the other axial end of the component case can be closed by the cover.

In the aforementioned embodiment, although the hole to be provided on the other axial end of the component case is provided on the ceiling portion of the component case, the hole may be provided on the side wall portion on the other end of the component case, if the hole is provided only for the purpose of securing breathability between the internal space and outer space of the component case.

Although preferred embodiments of the invention have been described and illustrated with reference to the accompanying drawings, it will be understood by those skilled in the art that these are by way of example, and that various changes and modifications may be made without departing from the spirit and scope of the invention, which is defined only to the appended claims.

What is claimed is:

1. A mold-type electronic control unit comprising a unit body having a plurality of components on a printed circuit board and a molded portion which is injection molded so as to cover said unit body, said plurality of components including a specific component having an exposure required portion required to be exposed to outside when being used, said unit comprising:

a component case having an opening opened toward said printed circuit board at one axial end of the case, having a hole for opening an internal space of the component case to outside at the other axial end of the case, having a packing receiving surface extending so as to surround a central axis of the case outside thereof, with said packing receiving surface directed to the other axial end of the component case and one axial end of the component case being fixed to said printed circuit board;

a first packing which is press-fitted into said component case from said opening to prevent resin for molding from flowing into the internal space of the component case when said molded portion is injection molded; and a second packing secured to said packing receiving surface so as to contact with an inner surface of a mold for injection molding to prevent resin for molding from flowing toward the hole of the component case when said molded portion is injection molded, wherein said first packing comprises a recess portion formed so as to receive said specific component and a window portion one end of which is opened to said recess portion and the other end of which is opened to said component case, and is arranged so that said recess portion is opened to said printed circuit board, wherein said specific component is housed in said recess portion of the first packing, and wherein said exposure required portion of said specific component is exposed to the internal space of said component case through said window portion.

2. The mold-type electronic control unit according to claim 1, wherein said specific component is a pressure sensor having a pressure introducing portion, and wherein said exposure required portion is the pressure introducing portion of the pressure sensor.

3. The mold-type electronic control unit according to claim 1, wherein said specific component is a variable impedance element having an operation knob externally operated, and wherein said exposure required portion is the operation knob of the variable impedance element.

4. The mold-type electronic control unit according to claim 1, wherein said specific component is a display device, and wherein said exposure required portion is an indicator of the display device.

5. The mold-type electronic control unit according to claim 1, wherein said unit body comprises a unit side connector to be connected to an external connector connected to an external circuit when a circuit comprising said printed circuit board and said plurality of components is connected to said external circuit, wherein said unit side connector is fixed to the printed circuit board, and wherein most parts of said unit side connector except for a tip portion connected to said external connector are covered with said molded portion.

6. The mold-type electronic control unit according to claim 1, wherein said molded portion is formed by polyaramid resin.

7. A method for manufacturing a mold-type electronic control unit comprising a first process for forming a unit body having on a printed circuit board a plurality of components including a specific component having an exposure required portion required to be exposed to outside when being used and a second process for forming a molded portion covering said unit body, wherein said first process comprises:

a step of: providing a component case having an opening opened toward said printed circuit board at one axial end of the case, a hole for opening an internal space of said component case to outside at the other axial end of the case, and a packing receiving surface extending so as to surround a central axis of the case outside thereof, with said packing receiving surface directed to the other axial end of said component case; providing a first packing having a recess receiving said specific component and a window portion one end of which is opened in said recess and the other end of which is opened in said component case, and being press-fitted from said opening of said component case into said component case; and providing a second packing fixed to said packing receiving surface; and a step of fixing said component case to the printed circuit board, with said specific component fitted to the recess, and with said exposure required portion of the specific component is exposed to the internal space of the component case through said window portion; and wherein said second process comprises:

a step of inserting said unit body to a mold for injection molding with the second packing being contacted with an inner surface of the mold; and a step of injecting melted resin into said mold while said first packing preventing resin from flowing into the component case and preventing resin for molding from flowing toward said hole of the component case.

* * * * *